(12) United States Patent
Yosui et al.

(10) Patent No.: US 10,354,939 B2
(45) Date of Patent: Jul. 16, 2019

(54) MULTILAYER BOARD AND ELECTRONIC DEVICE

(71) Applicant: Murata Manufacturing Co., Ltd., Nagaokakyo-shi, Kyoto-fu (JP)

(72) Inventors: Kuniaki Yosui, Nagaokakyo (JP); Takahiro Baba, Nagaokakyo (JP); Yoshiyuki Mashimo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/952,279

(22) Filed: Apr. 13, 2018

(65) Prior Publication Data

US 2018/0233429 A1  Aug. 16, 2018

Related U.S. Application Data

(63) Continuation of application No. PCT/JP2016/081427, filed on Oct. 24, 2016.

(30) Foreign Application Priority Data

Nov. 17, 2015 (JP) ................................ 2015-224965

(51) Int. Cl.
*H01L 23/538* (2006.01)
*H01L 23/367* (2006.01)
(Continued)

(52) U.S. Cl.
CPC .......... *H01L 23/3675* (2013.01); *H01L 23/12* (2013.01); *H01L 23/36* (2013.01);
(Continued)

(58) Field of Classification Search
CPC ..... H01L 23/12; H01L 23/36; H01L 23/3675; H01L 23/3677; H01L 23/4334;
(Continued)

(56) References Cited

U.S. PATENT DOCUMENTS

2008/0043444 A1  2/2008  Hasegawa et al.
2013/0114212 A1  5/2013  Tada et al.
(Continued)

FOREIGN PATENT DOCUMENTS

JP   11-220226 A   8/1999
JP   2003-060523 A   2/2003
(Continued)

OTHER PUBLICATIONS

Official Communication issued in International Patent Application No. PCT/JP2016/081427, dated Jan. 10, 2017.
(Continued)

*Primary Examiner* — Long K Tran
(74) *Attorney, Agent, or Firm* — Keating & Bennett, LLP

(57) ABSTRACT

A multilayer board includes a base including insulating layers stacked in a stacking direction, and a mounting surface at an end of the base in a first direction along the stacking direction, an electronic component inside the base, and a first heat dissipator extending through at least one of the insulating layers from a surface of the electronic component located at an end of the electronic component in the first direction to the mounting surface. When a section of the first heat dissipator is defined as a first section, and a section of the first heat dissipator located farther in a second direction along the layer stacking direction than the first section is defined as a second section, there is a combination of a first section and a second section in which the second section extends farther outward than the first section when viewed from the layer stacking direction.

20 Claims, 13 Drawing Sheets

(51) Int. Cl.
| | |
|---|---|
| *H01L 23/12* | (2006.01) |
| *H01L 23/36* | (2006.01) |
| *H01L 23/00* | (2006.01) |
| *H01L 23/433* | (2006.01) |
| *H05K 1/02* | (2006.01) |
| *H05K 1/18* | (2006.01) |
| *H05K 3/46* | (2006.01) |
| *H01L 25/10* | (2006.01) |
| *H05K 1/14* | (2006.01) |
| *H05K 3/40* | (2006.01) |

(52) U.S. Cl.
CPC ...... *H01L 23/3677* (2013.01); *H01L 23/4334* (2013.01); *H01L 23/5383* (2013.01); *H01L 23/5389* (2013.01); *H01L 24/24* (2013.01); *H01L 24/32* (2013.01); *H01L 24/33* (2013.01); *H01L 24/73* (2013.01); *H05K 1/0204* (2013.01); *H05K 1/186* (2013.01); *H05K 3/4697* (2013.01); *H01L 24/25* (2013.01); *H01L 25/105* (2013.01); *H01L 2224/04105* (2013.01); *H01L 2224/12105* (2013.01); *H01L 2224/16225* (2013.01); *H01L 2224/16227* (2013.01); *H01L 2224/19* (2013.01); *H01L 2224/2402* (2013.01); *H01L 2224/24141* (2013.01); *H01L 2224/24265* (2013.01); *H01L 2224/25171* (2013.01); *H01L 2224/32057* (2013.01); *H01L 2224/32227* (2013.01); *H01L 2224/32245* (2013.01); *H01L 2224/33051* (2013.01); *H01L 2224/33519* (2013.01); *H01L 2224/73267* (2013.01); *H01L 2225/1035* (2013.01); *H01L 2924/15311* (2013.01); *H01L 2924/19105* (2013.01); *H05K 1/021* (2013.01); *H05K 1/141* (2013.01); *H05K 3/4069* (2013.01); *H05K 3/4632* (2013.01); *H05K 2201/10416* (2013.01)

(58) Field of Classification Search
CPC . H01L 23/5383; H01L 23/5389; H01L 24/24; H01L 24/32; H01L 24/33; H01L 24/73; H05K 1/0204; H05K 1/186; H05K 3/4697
USPC .......................................................... 257/700
See application file for complete search history.

(56) References Cited

U.S. PATENT DOCUMENTS

| | | | | |
|---|---|---|---|---|
| 2013/0261444 | A1* | 10/2013 | Green | A61N 5/062 600/431 |
| 2014/0345931 | A1* | 11/2014 | Huang | H01L 23/49534 174/261 |
| 2015/0036341 | A1* | 2/2015 | Ge | F21V 3/061 362/240 |

FOREIGN PATENT DOCUMENTS

| | | |
|---|---|---|
| JP | 2006-019340 A | 1/2006 |
| JP | 2006-093565 A | 4/2006 |
| JP | 2010-157663 A | 7/2010 |
| JP | 2012-195464 A | 10/2012 |
| JP | 2014-067819 A | 4/2014 |
| JP | 2014-239142 A | 12/2014 |
| JP | 2015-162559 A | 9/2015 |
| WO | 2014076779 A1 | 5/2014 |

OTHER PUBLICATIONS

Official Communication issued in Japanese Patent Application No. 2017-551790, dated May 28, 2019.

* cited by examiner

MULTILAYER BOARD AND ELECTRONIC DEVICE

CROSS REFERENCE TO RELATED APPLICATIONS

This application claims the benefit of priority to Japanese Patent Application No. 2015-224965 filed on Nov. 17, 2015 and is a Continuation Application of PCT Application No. PCT/JP2016/081427 filed on Oct. 24, 2016. The entire contents of each application are hereby incorporated herein by reference.

BACKGROUND OF THE INVENTION

1. Field of the Invention

The present invention relates to a multilayer board incorporating an electronic component, and an electronic device.

2. Description of the Related Art

A known multilayer board, for example, a wireless communication module is disclosed in Japanese Patent Application Publication No. 2003-60523. FIG. 12 is a sectional view showing the structure of the wireless communication module 500 disclosed in Japanese Patent Application Publication No. 2003-60523.

The wireless communication module 500 includes a multilayer board 502 and a main board 504. The multilayer substrate 504 is mounted on the main board 504. The multilayer board 502 includes a body 506, a passive element 508, and a heat dissipator plate 510. The body 506 includes a plurality of dielectric layers stacked on one another in an up-down direction. The passive element 508 is disposed in a space in the body 506. The heat dissipator plate 510 covers the passive element 508 from below so that the passive element 508 will not be exposed to the outside.

In the wireless communication module 500, the heat dissipator plate 510 is soldered to an external electrode of the main board 504. Therefore, the heat generated by the passive element 508 is transferred to the main board 504 via the heat dissipator plate 510.

The wireless communication module 500 has a problem in that the heat dissipator plate 510 easily comes off or is detached from the body 506.

SUMMARY OF THE INVENTION

Preferred embodiments of the present invention provide multilayer boards and electronic devices wherein a heat dissipator does not detach from a base easily.

A multilayer board according to a preferred embodiment of the present invention includes a base including insulating layers stacked on one another along a layer stacking direction, and a mounting surface located at an end of the base in a first direction along the layer stacking direction in which the insulating layers are stacked; an electronic component disposed inside the base; and a first heat dissipator extending through one or more of the insulating layers from a surface of the electronic component located at an end of the electronic component in the first direction along the layer stacking direction to the mounting surface and not connected to any external electrodes of the electronic component, the first heat dissipator being made of a material having a second coefficient of thermal conductivity higher than a first coefficient of thermal conductivity of a material of the insulating layer. When a section of the first heat dissipator which is perpendicular or substantially perpendicular to the layer stacking direction is defined as a first section, and a section of the first heat dissipator which is perpendicular or substantially perpendicular to the layer stacking direction and located farther in a second direction along the layer stacking direction than the first section is defined as a second section, there is a combination of a first section and a second section in which the second section extends farther outward than the first section when viewed from the layer stacking direction.

An electronic device according to a preferred embodiment of the present invention includes a mother board, and a multilayer board mounted on the mother board. The multilayer board includes a base including insulating layers stacked on one another along a layer stacking direction, and a mounting surface located at an end of the base in a first direction along the layer stacking direction in which the insulating layers are stacked; an electronic component disposed inside the base; and a first heat dissipator extending through one or more of the insulating layers from a surface of the electronic component located at an end of the electronic component in the first direction along the layer stacking direction to the mounting surface and not connected to any external electrodes of the electronic component, the first heat dissipator being made of a material having a second coefficient of thermal conductivity higher than a first coefficient of thermal conductivity of a material of the insulating layers. The first heat dissipator is in direct contact with the mother board or is connected to the mother board via a second joining member made of a material having a fourth coefficient of thermal conductivity higher than the first coefficient of thermal conductivity. When a section of the first heat dissipator which is perpendicular or substantially perpendicular to the layer stacking direction is defined as a first section, and a section of the first heat dissipator which is perpendicular or substantially perpendicular to the layer stacking direction and located farther in a second direction along the layer stacking direction than the first section is defined as a second section, there is a combination of a first section and a second section at which the second section extends farther outward than the first section when viewed from the layer stacking direction.

According to preferred embodiments of the present invention, heat dissipators are prevented from easily detaching from bases.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
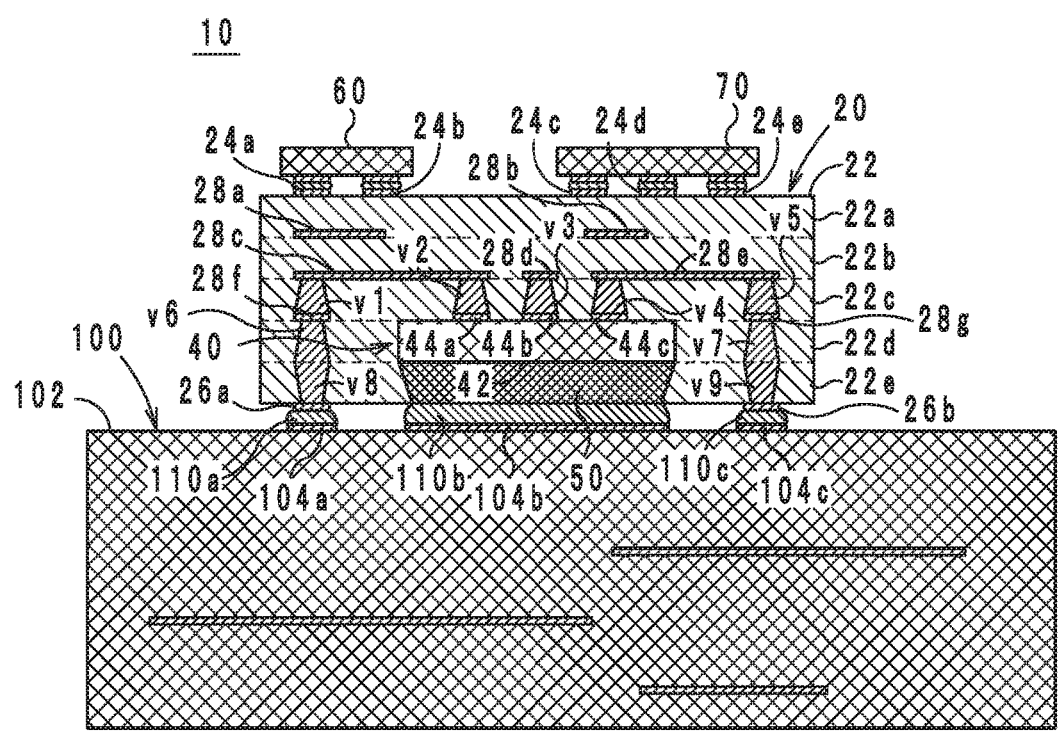
FIG. 1 is a sectional view of an electronic device 10 according to a preferred embodiment of the present invention.
Figure 2A:
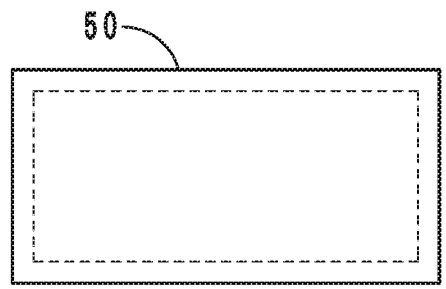
FIG. 2A is a top view of a heat dissipator 50.
Figure 2A:
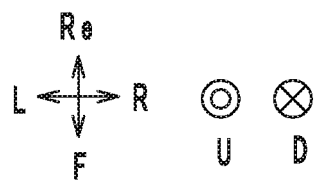
Figure 2B:
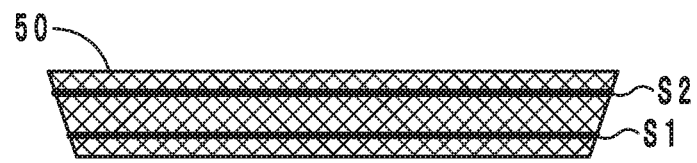
FIG. 2B is a sectional view of the heat dissipator 50 when it is separated from the electronic device 10 shown in FIG. 1.
Figure 2B:
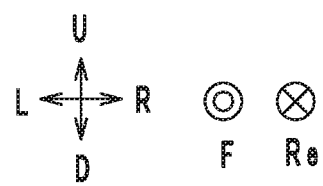

The structures of multilayer boards and electronic devices according to preferred embodiments of the present invention will hereinafter be described with reference to the drawings. FIG. 1 is a sectional view of an electronic device 10 according to a preferred embodiment of the present invention. FIG. 2A is a top view of a heat dissipator 50. FIG. 2B is a sectional view of the heat dissipator 50 when it is extracted from the electronic device 10 shown in FIG. 1. In the following description, the direction in which layers of the multilayer board 20 are stacked will be referred to as an up-down direction. The horizontal direction in FIG. 1 will be referred to as a right-left direction. The direction perpendicular or substantially perpendicular to the paper surface of FIG. 1 will be referred to as a front-rear direction. The up-down direction, the right-left direction, and the front-rear direction are orthogonal or substantially orthogonal to one another.

For example, the electronic device 10 may be a cellphone, a personal computer, a game machine, a wearable terminal device, or other suitable electronic device. FIG. 1 shows only a module mounted in the electronic device 10, and the case and other components of the electronic device 10 are omitted. As shown in FIG. 1, the electronic device 10 includes a multilayer board 20, chip components 60 and 70, and a mother board 100.

First, the multilayer board 20 is described. The multilayer board 20 is preferably a flexible plate-shaped board that is rectangular or substantially rectangular when viewed from above. As shown in FIG. 1, the multilayer board 20 includes a base 22, external electrodes 24a to 24e, 26a and 26b, wiring conductive layers 28a to 28g, via-hole conductors v1 to v9, a semiconductor integrated circuit 40, and a heat dissipator 50. Other external electrodes in addition to the external electrodes 24a to 24e, 26a and 26b are provided, but the external conductors are not shown in FIG. 1, except for the external electrodes 24a to 24e, 26a and 26b. Similarly, other wiring conductive layers in addition to the wiring conductive layers 28a to 28g are provided, but the wiring conductive layers are not shown in FIG. 1, except for the wiring conductive layers 28a to 28g. Similarly, other via-hole conductors in addition to the via-hole conductors v1 to v9 are provided, but the via-hole conductors are not shown in FIG. 1, except for the via-hole conductors v1 to v9.

As shown in FIG. 1, the base 22 is a flexible plate-shaped board that is rectangular or substantially rectangular when viewed from above. When the base 22 is viewed from above, the long sides of the base 22 extend in the right-left direction, and the short sides of the base 22 extend in the front-rear direction. The base 22 is a laminated body including insulating sheets 22a to 22e (an example of a plurality of insulating layers) stacked in this order from top to bottom. The base 22 includes two principle surfaces. In the following description, the upper (an example of farther in a second direction along the layer stacking direction) principle surface of the base 22 will be referred to as a front surface, and the lower (an example of farther in a first direction along the layer stacking direction) principle surface of the base 22 will be referred to as a back surface. The back surface of the base 22 is a mounting surface that faces the mother board 100 when the multilayer board 20 is mounted on the mother board 100.

When viewed from above, each of the insulating sheets 22a to 22e is preferably rectangular or substantially rectangular and has the same shape as the base 22. The insulating sheets 22a to 22e are preferably insulating layers made of a material including flexible thermoplastic resin, such as polyimide, liquid polymer or other suitable resin, for example. In the following description, the upper principle surface of each of the insulating sheets 22a to 22e will be referred to as a front surface, and the lower principle surface of each of the insulating sheets 22a to 22e will be referred to as a back surface.

The external electrodes 24a to 24e are rectangular or substantially rectangular conductive layers and are disposed on the front surface of the insulating sheet 22a. The external electrodes 24a to 24e are arranged in a line in this order from left to right.

The external electrodes 26a and 26b (examples of a second external electrode) are rectangular or substantially rectangular conductive layers and are disposed on the back surface of the insulating sheet 22e (that is, on the mounting surface). The external electrode 26a is positioned near the left edge of the base 22, and the external electrode 26b is positioned near the right edge of the base 22.

The semiconductor integrated circuit 40 is a plate-shaped electronic component that is rectangular or substantially rectangular when viewed from above. The semiconductor integrated circuit 40 is disposed inside the base 22. More specifically, the semiconductor integrated circuit 40 includes a body 42, and external electrodes 44a to 44c. The body 42 has a rectangular or substantially rectangular plate shape when viewed from above. In the following description, the upper principle surface of the body 42 will be referred to as a front surface, and the lower principle surface of the body 42 will be referred to as a back surface.

The external electrodes 44a to 44c (examples of a first external electrode) are rectangular or substantially rectangular conductive layers and are disposed on the front surface of the body 42. The external electrodes 44a to 44c are disposed in a line in this order from left to right. The semiconductor integrated circuit 40 includes other external electrodes as well as the external electrodes 44a to 44c although they are not shown in the drawings. However, there are no external electrodes on the back surface of the body 42.

A rectangular hole is provided in the insulating sheet 22d to extend therethrough in the up-down direction. When viewed from above, the shape of the rectangular hole is the same or substantially the same as the shape of the body 42. The thickness (the dimension in the up-down direction) of the body 42 is the same or substantially the same as the thickness of the insulating sheet 22d. Accordingly, the semiconductor integrated circuit 40 is fitted in the hole in the insulating sheet 22d. Therefore, the semiconductor integrated circuit 40 is located near the back surface of the base 22 rather than near the front surface of the base 22.

The heat dissipator 50 is preferably a rectangular or substantially rectangular plate-shaped member when viewed from above as shown in FIG. 2A. In the following description, the upper principle surface of the heat dissipator 50 will be referred to as a front surface, and the lower principle surface of the heat dissipator 50 will be referred to as a back surface. In FIG. 2A, the solid line indicates the outer edge of the front surface of the heat dissipator 50, and the dashed line indicates the outer edge of the back surface of the heat dissipator 50. The heat dissipator 50 is preferably in the shape of a truncated quadrangular pyramid, for example, and with increasing distance from its upper surface and decreasing distance from its lower surface, the cross-sectional area of the heat dissipator 50 perpendicular or substantially perpendicular to the up-down direction is reduced.

The shape of the heat dissipator 50 will be described in more detail below. In FIG. 2B, the section S1 (an example of a first section) and the section S2 (an example of a second section) of the heat dissipator 50 are defined as follows. The section S1 is a cross-section perpendicular or substantially perpendicular to the up-down direction. The section S2 is a cross-section that is located above (an example of located farther in a second direction along the layer stacking direction) the section S1 and is perpendicular or substantially perpendicular to the up-down direction. The sections S1 and S2 may be at arbitrary positions in the up-down direction, and FIG. 2B shows only an example thereof. However, it is required that the section S2 is located above the section S1.

In the heat dissipator 50, there is a combination of a section S1 and a section S2 in which the section S2 extends further outward than the section S1 when viewed from above. This means that there is at least one such combination in which the section S2 extends farther outward than the section S1 and that there may be a combination of S1 and S2 in which the section S2 does not extend outward from the section S1.

However, the heat dissipator 50 is preferably in the shape of a truncated quadrangular pyramid, and therefore, for any combination of a section S1 and a section S2 of the heat dissipator 50, the section S2 extends farther outward than the section S1 when viewed from above. In other words, there is no combination of a section S1 and a section S2 in which the section S2 does not extend outward from the section S1 when viewed from above. For any combination of a section S1 and a section S2 of the heat dissipator 50, it is also true that the area of the section S2 is larger than the area of the section S1. In other words, there is no combination of a section S1 and a section S2 in which the area of the section S2 is equal to or smaller than the area of the section S1.

The heat dissipator 50 is preferably made of a material having a coefficient of thermal conductivity E2 (an example of a second coefficient of thermal conductivity) that is higher than the coefficient of thermal conductivity E1 (an example of a first coefficient of thermal conductivity) of the material of the insulating sheets 22a to 22e. In the present preferred embodiment, the heat dissipator 50 is preferably a metal plate made of copper or other suitable metal, for example. The heat dissipator 50 may be a plate made of gold, aluminum, silver or other metal or may be a plate made of a carbon material or other suitable material. The heat dissipator 50 is preferably not a combined member made by combination of a conductor extending through the insulating sheet 22e, a conductive layer disposed on the insulating sheet 22e, and other members, but is preferably a single member made of one material.

The heat dissipator 50 extends through the insulating sheet 22e from the back surface of the semiconductor integrated circuit 40 to the back surface of the base 22, and is not electrically connected to any of the external electrodes 44a to 44c of the semiconductor integrated circuit 40. In the present preferred embodiment, the heat dissipator 50 is disposed in the insulating sheet 22e. The insulating sheet 22e includes a rectangular or substantially rectangular hole that extends through the insulating sheet 22e in the up-down direction. The shape of the rectangular hole made in the insulating sheet 22e is preferably the same or substantially the same as the shape of the heat dissipator 50 when viewed from above. The thickness (dimension in the up-down direction) of the heat dissipator 50 is preferably equal or substantially equal to the thickness of the insulating sheet 22e. Accordingly, the heat dissipator 50 is fitted in the hole in the insulating sheet 22e. Therefore, the front surface of the heat dissipator 50 and the back surface of the semiconductor integrated circuit 40 are in direct contact with each other. However, the front surface of the heat dissipator 50 and the back surface of the semiconductor integrated circuit 40 may be connected together via a thermal grease, a conductive paste or other suitable joining members (an example of a first joining member) preferably made of a material having a coefficient of thermal conductivity E3 (an example of a third coefficient of thermal conductivity) higher than the coefficient of thermal conductivity E1.

No external electrodes are disposed on the back surface of the body 42, and therefore, the front surface of the heat dissipator 50 is not in contact with any external electrodes of the body 42. Accordingly, the heat dissipator 50 is preferably maintained in a floating state. The floating state means a state in which a conductor is not connected to any power potential. However, the heat dissipator 50 is not necessarily maintained in a floating state, but may be connected to a ground potential, for example. In terms of heat dissipation from the semiconductor integrated circuit 40, the area of the front surface of the heat dissipator 50 is preferably equal to or larger than, for example, about 50% of the area of the back surface of the semiconductor integrated circuit 40. Since the heat dissipator 50 is relatively large, the heat dissipator 50 does not include any via-hole or any other common interlayer connection conductors.

The wiring conductive layers 28a to 28g (examples of a wiring conductive layer) are linear conductors disposed inside the base 22. More specifically, the wiring conductive layers 28a and 28b are disposed on the front surface of the insulating sheet 22b and are arranged in this order from left to right. The wiring conductive layers 28c to 28e are disposed on the front surface of the insulating sheet 22c and are arranged in this order from left to right. The wiring conductive layer 28c extends in the right-left direction. The right end of the wiring conductive layer 28c overlaps the external electrode 44a when viewed from above. The left end of the wiring conductive layer 28c overlaps the external electrode 26a when viewed from above. The wiring conductive layer 28d extends in the front-rear direction. The wiring conductive layer 28e extends in the right-left direction. The left end of the wiring conductive layer 28e overlaps the external electrode 44c when viewed from above. The right end of the wiring conductive layer 28e overlaps the external electrode 26b when viewed from above. The wiring conductive layer 28f is disposed on the front surface of the insulating sheet 22d and is located on the left side of the semiconductor integrated circuit 40. The wiring conductive layer 28f overlaps the left end of the wiring conductive layer 28c when viewed from above. The wiring conductive layer 28g is disposed on the front surface of the insulating sheet 22d and is located on the right side of the semiconductor integrated circuit 40. The wiring conductive layer 28g overlaps the right end of the wiring conductive layer 28e when viewed from above.

The via-hole conductors v1 and v2 extend through the insulating sheet 22c in the up-down direction and are disposed in this order from left to right. Each of the via-hole conductors v1 and v2 becomes thicker with increasing distance from the upper end thereof and decreasing distance from the lower end thereof. The via-hole conductor v1 connects the left end of the wiring conductive layer 28c to the wiring conductive layer 28f. The via-hole conductor v2 connects the right end of the wiring conductive layer 28c to the external electrode 44a.

The via-hole conductors v6 and v8 extend through the insulating sheets 22d and 22e, respectively, in the up-down direction, and are located on the left side of the semiconductor integrated circuit 40. The via-hole conductor v6 becomes thicker with increasing distance from the upper end thereof and decreasing distance from the lower end thereof. The via-hole conductor v8 becomes thinner with increasing distance from the upper end thereof and decreasing distance from the lower end thereof. The via-hole conductors v6 and v8 are connected to each other to define a series of via-hole conductors to connect the wiring conductive layer 28f to the external electrode 26a. Thus, the via-hole conductors v1, v2, v6 and v8 (an example of an interlayer connection conductor) and the wiring conductive layers 28c and 28f define a connector to connect the external electrode 44a to the external electrode 26a. In the present preferred embodiment, the connector extends upward from the external electrode 44a, thereafter extends leftward (an example of in a direction perpendicular or substantially perpendicular to the layer stacking direction), and further extends downward to the external electrode 26a.

The via-hole conductors v4 and v5 extend through the insulating sheet 22c in the up-down direction and are disposed in this order from left to right. Each of the via-hole conductors v4 and v5 becomes thicker with increasing distance from the upper end thereof and decreasing distance from the lower end thereof. The via-hole conductor v4 connects the left end of the wiring conductive layer 28e to the external electrode 44c. The via-hole conductor v5 connects the right end of the wiring conductive layer 28e to the external electrode 28g.

The via-hole conductors v7 and v9 extend through the insulating sheets 22d and 22e, respectively, in the up-down direction, and are located on the right side of the semiconductor integrated circuit 40. The via-hole conductor v7 becomes thicker with increasing distance from the upper end thereof and decreasing distance from the lower end thereof. The via-hole conductor v9 becomes thinner with increasing distance from the upper end thereof and decreasing distance from the lower end thereof. The via-hole conductors v7 and v9 are connected to each other to define a series of via-hole conductors to connect the wiring conductive layer 28g to the external electrode 26b. Thus, the via-hole conductors v4, v5, v7 and v9 and the wiring conductive layers 28e and 28g define a connector to connect the external electrode 44c to the external electrode 26b. In the present preferred embodiment, the connector extends upward from the external electrode 44c, thereafter extends rightward (an example of in a direction perpendicular or substantially perpendicular to the layer stacking direction), and further extends downward to the external electrode 26b.

The via-hole conductor v3 extends through the insulating sheet 22c in the up-down direction. The via-hole conductor v3 becomes thicker with increasing distance from the upper end thereof and decreasing distance from the lower end thereof. The via-hole conductor v3 connects the wiring conductive layer 28d to the external electrode 44b. The external electrode 44b is connected to an external electrode (not shown) disposed on the back surface of the base 22 via the via-hole conductor v3 and other via-hole conductors and wiring conductive layers which are not shown in the drawings.

The wiring conductive layers 28a to 28g and the external electrodes 24a to 24e, 26a and 26b are preferably made of copper, for example. The surfaces of the wiring conductive layers 28a to 28g and the external electrodes 24a to 24e, 26a and 26b are preferably galvanized. The via-hole conductors v1 to v9 are preferably made by solidifying a conductive paste primarily including metal, such as copper, tin, silver or other suitable metal, for example.

Next, the chip components 60 and 70 will be described. The chip components 60 and 70 are electronic components to be mounted on the front surface of the multilayer board 20, and the chip components 60 and 70 are, for example, capacitors, inductors and other suitable components. The chip components 60 and 70 may be semiconductor integrated circuits. The chip component 60 is soldered to the external electrodes 24a and 24b, and mounted on the multilayer board 20. The chip component 70 is soldered to the external electrodes 24c to 24e, and mounted on the multilayer board 20. The multilayer board 20 and the chip components 60 and 70 define a component-mounted board. Depending on the intended use, the chip components 60 and 70 are not necessarily mounted. In other words, the multilayer board 20 may be used with no components mounted thereon.

Next, the mother board 100 will be described. The mother board 100 is a mother board for a cellphone or other suitable device, and it is a large circuit board. The mother board 100 is preferably a non-flexible rigid board, but the mother board 100 may be flexible. The mother board 100 includes a body 102 and external electrodes 104a to 104c. The body 102 is preferably a rectangular or substantially rectangular plate-shaped multilayer board when viewed from above. Electronic circuits are provided in and/or on the body 102. In the following description, the upper principle surface of the body 102 will be referred to as a front surface, and the lower principle surface of the body 102 will be referred to as a back surface.

The external electrodes 104a to 104c are rectangular or substantially rectangular conductive layers disposed on the front surface of the body 102. The external electrodes 104a to 104c are disposed in a line in this order from left to right. The external electrode 104b (an example of a third external electrode) is preferably larger than the external electrodes 104a and 104c, and the shape of the external electrode 104b is the same or substantially the same as the shape of the back surface of the heat dissipator 50 when viewed from above. The mother board 100 includes other external electrodes as well as the external electrodes 104a to 104c although they are not shown in the drawings.

The multilayer board 20 is mounted on the mother board 100. More specifically, the external electrodes 26a and 26b are connected to the external electrodes 104a and 104c via solders 110a and 110c, respectively. The heat dissipator 50 is connected to the external electrode 104b via a solder 110b (an example of a second joining member). The solder 110b is preferably made of a material with a coefficient of thermal conductivity E4 (an example of a fourth coefficient of thermal conductivity) higher than the coefficient of thermal conductivity E1. Accordingly, the heat from the heat dissipator 50 is transferred to the external electrode 104b via the solder 110b. A thermal grease or a conductive paste, for example, may be used instead of the solder 110b. Alternatively, the back surface of the heat dissipator 50 may be in direct contact with the external electrode 104b.

Figure 3:
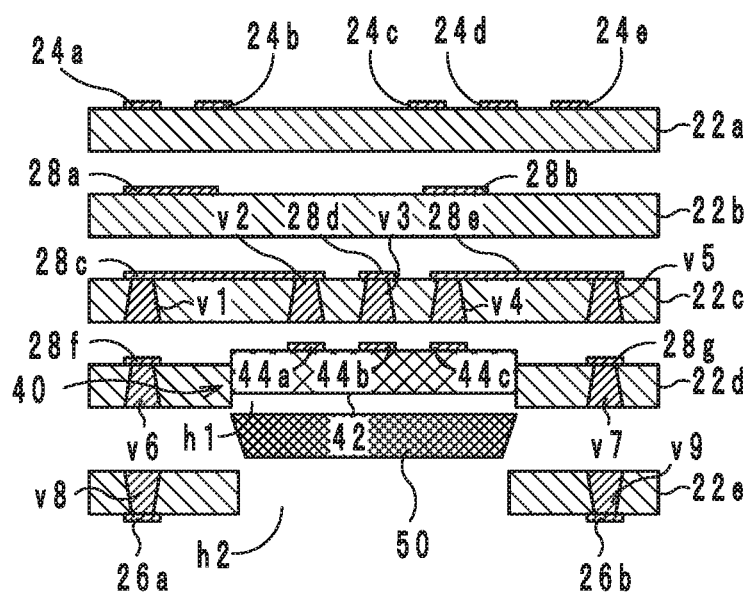
FIG. 3 is a sectional view of the electronic device 10 at a stage of a manufacturing process.
Figure 3:
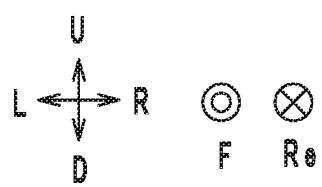
Figure 4:
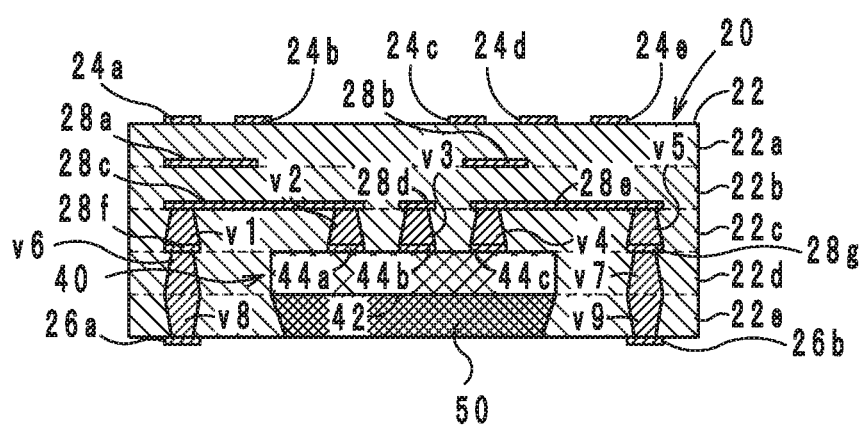
FIG. 4 is a sectional view of the electronic device 10 at another stage of the manufacturing process.
Figure 4:
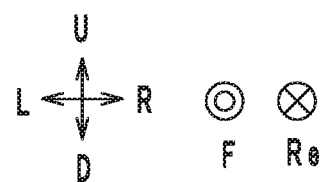
Figure 5:
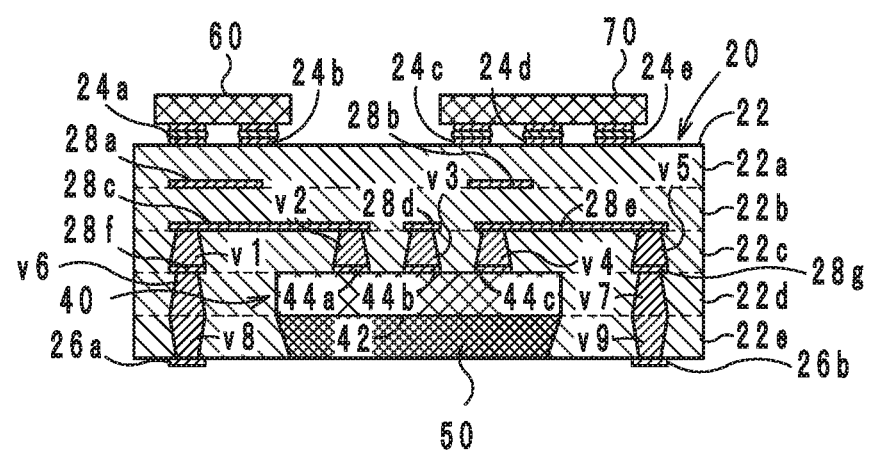
FIG. 5 is a sectional view of the electronic device 10 at another stage of the manufacturing process.
Figure 5:
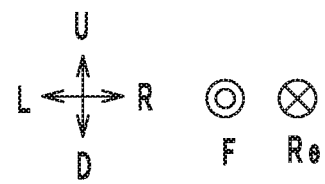

A non-limiting example of a method for manufacturing the electronic device 10 will hereinafter be described with reference to the drawings. FIGS. 3 to 5 are sectional views of the electronic device 100 during a manufacturing process thereof. In the following, a case of manufacturing one multilayer board 20 is described as an example. Practically, however, large-size insulating sheets are stacked and cut, and thus, a plurality of multilayer boards 20 are manufactured at the same time.

First, sheets made of liquid polymer are prepared as the insulating sheets 22a to 22e. Holes h1 and h2 are formed in the insulating sheets 22d and 22e by punching such that the holes h1 and h2 extend through the insulating sheets 22d and 22e, respectively, in the up-down direction.

A sheet of copper foil is formed on one principle surface of each of the insulating sheets 22a to 22e. Specifically, a sheet of copper foil is adhered onto the front surface of each of the insulating sheets 22a to 22d. Also, a sheet of copper foil is adhered onto the back surface of the insulating sheet 22e. Further, the copper foil on the insulating sheets 22a to 22e is galvanized for corrosion proof, and thus, the copper foil surfaces are smoothened. Any metal foil instead of copper foil may be used.

Next, the copper foil on the front surface of the insulating sheet 22a is patterned, and thus, the external electrodes 24a to 22e shown in FIG. 3, and other external electrodes and wiring conductive layers which are not shown in the drawings are formed on the front surface of the insulating sheet 22a. Specifically, on the copper foil on the front surface of the insulating sheet 22a, resists having the same or substantially the same shapes as the external electrodes 24a to 24e and the external electrodes and wiring conductive layers which are not shown in the drawings are printed. Thereafter, the copper foil is etched, and the portions of the copper foil that are not covered with the resists are removed. Thereafter, a cleaning solution (resist remover) is sprayed to remove the resists. Thus, the external electrodes 24a to 24e shown in FIG. 3 and other external electrodes and wiring conductive layers which are not shown in the drawings are formed on the front surface of the insulating sheet 22a by photolithography.

Next, as shown in FIG. 3, the wiring conductive layers 28a to 28g are formed on the front surfaces of the insulating sheets 22b to 22d, respectively. Also, the external electrodes 26a and 26b shown in FIG. 3, and other external electrodes which are not shown in the drawings are formed on the back surface of the insulating sheet 22e. The process of forming the wiring conductive layers 28a to 28g, the external electrodes 26a and 26b, and other external electrodes which are not shown in the drawings is the same or substantially the same as the process of forming the external electrodes 24a to 24e and other external electrodes and wiring conductive layers which are not shown in the drawings, and a description of the process is omitted. When the multilayer board 20 includes any other conductive layers for a capacitor or other component, these conductive layers are formed by the same or substantially the same process of forming the external electrodes 24a to 24e, and other electrodes and wiring conductive layers which are not shown in the drawings.

Next, the insulating sheets 22a to 22e are irradiated with laser beams such that through holes are formed at positions at which the via-hole conductors v1 to v9 and other via-hole conductors which are not shown in the drawings are to be formed. A conductive paste preferably including primarily of copper, tin, silver or other suitable metal is filled in the through holes.

Next, the semiconductor integrated circuit 40 is fitted into the hole h1 of the insulating sheet 22d. Also, the heat generator 50 is fitted into the hole h2 of the insulating sheet h2. In this regard, the heat dissipator 50 is inserted downward into the hole h2 from above.

Next, thermocompression bonding is performed to assemble the multilayer board 20. Specifically, as shown in FIG. 3, the insulating sheets 22a to 22e are stacked, and thereafter, a pressure treatment and a heat treatment (that is, thermocompression bonding) are applied to the stack of the insulating sheets 22a to 22e in up-down direction. The pressure treatment is pinching the insulating sheets 22a to 22e. While the insulating sheets 22a to 22e are subjected to the pressure treatment and the heat treatment, the insulating sheets 22a to 22e are softened, and the conductive paste in the through holes are hardened. Thus, the insulating sheets 22a to 22e are bonded together, and the via-hole conductors v1 to v9 are formed. During the pressure treatment and the heat treatment, further, the thermoplastic resin in the insulating sheets 22a to 22e flows, and the inner surfaces of the holes h1 and h2 firmly adhere to the semiconductor integrated circuit 40 and the heat dissipator 50, respectively. In this manner, the multilayer board 20 shown in FIG. 20 is fabricated.

Next, as shown in FIG. 5, the chip components 60 and 70 are mounted on the multilayer board 20 preferably by solder, for example. In this manner, the component-mounted board is manufactured.

Lastly, the multilayer board 20 is mounted on the mother board 100 preferably by solder, for example, as shown in FIG. 1. Thereafter, the mother board 100 is housed in a casing, and thus, the electronic device 10 is manufactured.

The multilayer board 20 and the electronic device 10 according to the present preferred embodiment of the present invention have a high heat dissipation characteristic. More specifically, the heat dissipator 50 extends through the insulating sheet 22e from the back surface of the semiconductor integrated circuit 40 to the back surface of the base 22. Accordingly, when the multilayer board 20 is mounted on the mother board 100, the back surface of the heat dissipator 50 is brought into direct contact with the mother board 100 or is connected to the mother board 100 via a thermal grease made of a material having a coefficient of thermal conductivity higher than the coefficient of thermal conductivity E1. Then, heat is transferred from the semiconductor integrated circuit 40 straight to the mother board 100 via the heat dissipator 50. Thus, heat generated in the semiconductor integrated circuit 40 is able to be transferred to the mother board 100 via a short route. Therefore, the multilayer board 20 and the electronic device 10 have a high heat dissipation characteristic.

In the multilayer board 20 and the electronic device 10, in particular, the semiconductor integrated circuit 40 is positioned near the back surface of the base 22 rather than near the front surface of the base 22. Therefore, heat generated in the semiconductor integrated circuit 40 is able to be transferred to the mother board 100 via a short route. Therefore, the multilayer board 20 and the electronic device 10 have a high heat dissipation characteristic.

Also, in the multilayer board 20 and in the electronic device 50, the heat dissipator 50 does not detach from the base 22 easily. A multilayer board according to a comparative example will be described below for comparison with the multilayer board 20. The heat dissipator of the multilayer board according to the comparative example is not in the shape of a truncated quadrangular pyramid, but instead in the shape of a cuboid. There are no other differences between the multilayer board 20 and the multilayer board according to the comparative example. Therefore, the components of the multilayer board according to the comparative example will be provided with the same reference symbols as provided to the equivalent parts of the multilayer board 20.

In the multilayer board according to the comparative example, the heat dissipator 50 extends through the insulating sheet 22e from the back surface of the semiconductor integrated circuit 40 to the back surface of the base 22. The cross-sectional shape of the heat dissipator 50 is rectangular or substantially rectangular. The side surfaces of the heat dissipator 50 adhere to the inner surface of the hole of the insulating sheet 22e, and thus, the heat dissipator 50 is supported by the base 22. Therefore, when a high impact is applied to the multilayer board according to the comparative example, the heat dissipator 50 may detach from the base 22.

In view of that, the multilayer board 20 and the electronic device 10 are constructed such that there is a combination of a section S1 and a section S2 in which the section S2 extends farther outward than the section S1 when viewed from above. With this structure, even if the heat dissipator 50 is almost detached from the base 22, the section S2 gets caught by the inner surface of the hole of the insulating sheet 22e. Thus, the heat dissipator 50 is prevented from detaching from the base 22.

In the multilayer board 20 and the electronic device 10, it is possible to more effectively prevent the heat dissipator 50 from detaching from the base 22. The heat dissipator 50 is preferably in the shape of a truncated quadrangle pyramid, and therefore, for any combination of a section S1 and a section S2 of the heat dissipator 50, it is true that the section S2 extends farther outward than the section S1 when viewed from above. Accordingly, the heat dissipator 50 cannot move downward even a little. Thus, it is possible to more effectively prevent the heat dissipator 50 from detaching from the base 22.

In the multilayer board 20 and the electronic device 10, it is possible to more effectively prevent the heat dissipator 50 from detaching from the base 22. The heat dissipator 50 is preferably in the shape of a truncated quadrangle pyramid, and therefore, for any combination of a section S1 and a section S2 of the heat dissipator 50, it is true that the area of the section S2 is larger than the area of the section S1. Accordingly, the section S2 extends farther outward than the section S1 by a large margin. Thus, it is possible to more effectively prevent the heat dissipator 50 from detaching from the base 22.

Also, the multilayer board 20 and the electronic device 10 have a higher heat dissipation characteristic for the reason described below. More specifically, the heat dissipator 50 is connected to the external electrode 104b via a solder 110b. Thus, a space is prevented from being provided between the heat dissipator 50 and the external electrode 104b. This results in efficient heat transfer from the heat dissipator 50 to the external electrode 104b.

The multilayer board 20 and the electronic device 10 have a still higher heat dissipation characteristic for the reason described below. More specifically, when the heat dissipator 50 is connected to the semiconductor integrated circuit 40 via a thermal grease or other suitable bonding material, a space is prevented from being provided between the heat dissipator 50 and the semiconductor integrated circuit 40. This results in efficient heat transfer from the semiconductor integrated circuit 40 to the heat dissipator 50.

Moreover, in the multilayer board 20 and the electronic device 10, a signal, a power current and the like flowing between the external electrodes 44a and 26a and between the external electrodes 44c and 26b are reduced or prevented from being affected by heat. The connection from the external electrode 44a to the external electrode 26a will be described as an example. The via-hole conductors v1, v2, v6 and v8, and the wiring conductive layers 28c and 28f define a connector connecting the external electrode 44a to the external electrode 26a. The connector extends upward from the external electrode 44a, thereafter extends leftward, and further extends downward to the external electrode 26a. Thus, the connector is spaced away the heat dissipator 50. Therefore, a signal, a power current and the like flowing between the external electrodes 44a and 26a and between the external electrodes 44c and 26b are reduced or prevented from being affected by heat.

In the electronic device 10, the side surfaces of the heat dissipator 50 are preferably smooth inclined surfaces. Therefore, the insulating sheet 22e easily adheres to the side surfaces of the heat dissipator 50. Thus, the heat dissipator 50 is prevented from detaching from the base 22 more effectively.

Figure 6:
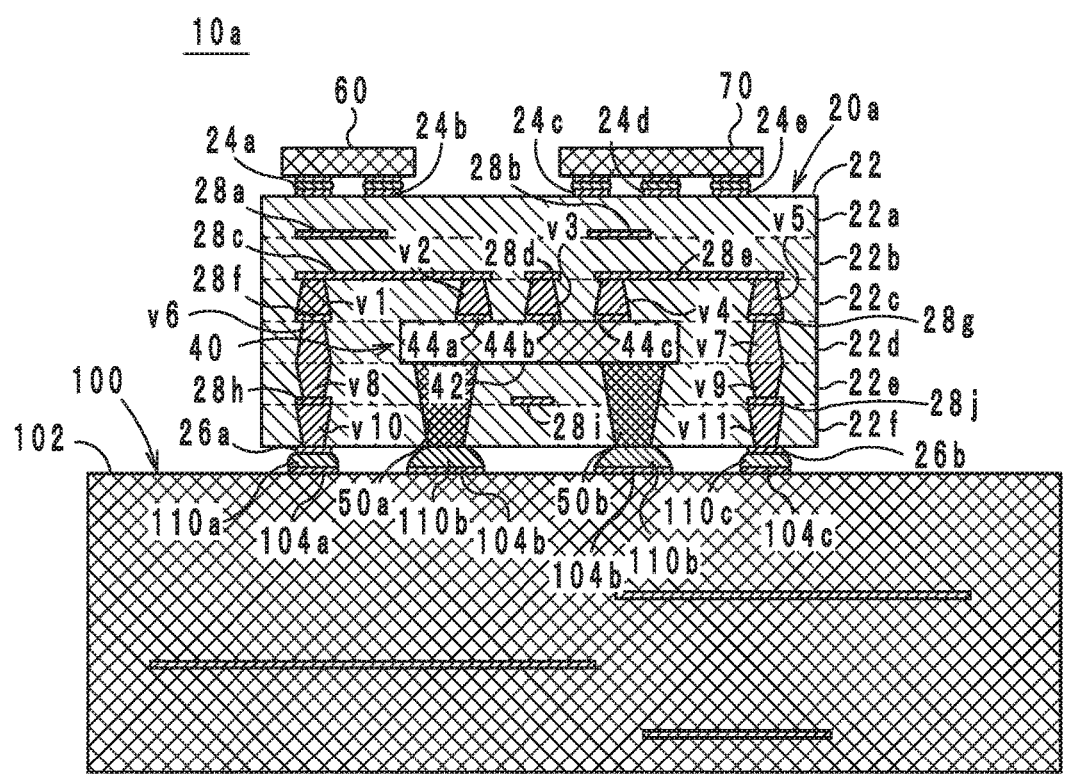
FIG. 6 is a sectional view of an electronic device 10a according to a first modification of a preferred embodiment of the present invention.
Figure 6:
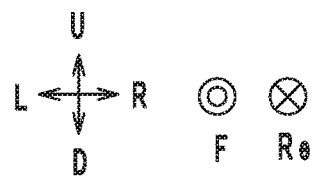

A multilayer board 20a and an electronic device 10a according to a first modification of a preferred embodiment of the present invention will be described below with reference to the drawings. FIG. 6 is a sectional view of the electronic device 10a according to the first modification.

The multilayer board 20a differs from the multilayer board 20 in that the multilayer board 20a further includes heat dissipators 50a and 50b, wiring conductive layers 28h to 28i, via-hole conductors v10 and v11, and an insulating sheet 22f. The following description of the multilayer board 20a is focused on the difference.

The base 22 includes insulating sheets 22a to 22f stacked in this order from top to bottom. The wiring conductive layer 28h is disposed on the front surface of the insulating sheet 22f. The wiring conductive layer 28h overlaps the left end of the wiring conductive layer 28a when viewed from above, and the wiring conductive layer 28h is connected to the lower end of the via-hole conductor v8. The via-hole conductor v10 extends through the insulating sheet 22f in the up-down direction to connect the wiring conductive layer 28h to the external electrode 26a.

The wiring conductive layer 28j is disposed on the front surface of the insulating sheet 22f. When viewed from above, the wiring conductive layer 28j overlaps the right end of the wiring conductive layer 28e and is connected to the lower end of the via-hole conductor v9. The via-hole conductor v11 extends through the insulating sheet 22f in the up-down direction to connect the wiring conductive layer 28j to the external electrode 26b.

The heat dissipators 50a and 50b extend through the insulating sheets 22e and 22f from the back surface of the semiconductor integrated circuit 40 to the back surface of the base 22, and the heat dissipators 50a and 50b are not connected to any of the external electrodes 44a through 44c of the semiconductor integrated circuit 40. The heat dissipators 50a and 50b are disposed in this order from left to right with a space in between. The wiring conductive layer 28i is disposed between the heat dissipator 50a (an example of a first heat dissipator) and the heat dissipator 50b (an example of a second heat dissipator) with respect to the right-left direction (an example of a direction perpendicular or substantially perpendicular to the layer stacking direction). As with the heat dissipator 50, each of the heat dissipators 50a and 50b is preferably in the shape of a truncated quadrangular pyramid. The heat dissipators 50a and 50b are thinner than the heat dissipator 50. The heat dissipators 50a and 50b are preferably plate-shaped or block-shaped members made of copper, for example. The heat dissipators 50a and 50b have no other differences from the heat dissipator 50, and the other components of the heat dissipators 50a and 50b will not be described.

The board 20a and the electronic device 10a have the same or substantially the same advantages and effects as the multilayer board 20 and the electronic device 10.

In the multilayer board 20a and the electronic device 10a, the multilayer board 20a has more flexibility in design. More specifically, near the back surface of the multilayer board 20a, the wiring conductive layers are arranged more densely. Therefore, in the multilayer board 20a, the heat dissipator 50 is divided into two heat dissipators 50a and 50b. Thus, the space for the wiring conductive layers is enlarged, which enables more flexibility in designing the multilayer board 20a.

Figure 7A:
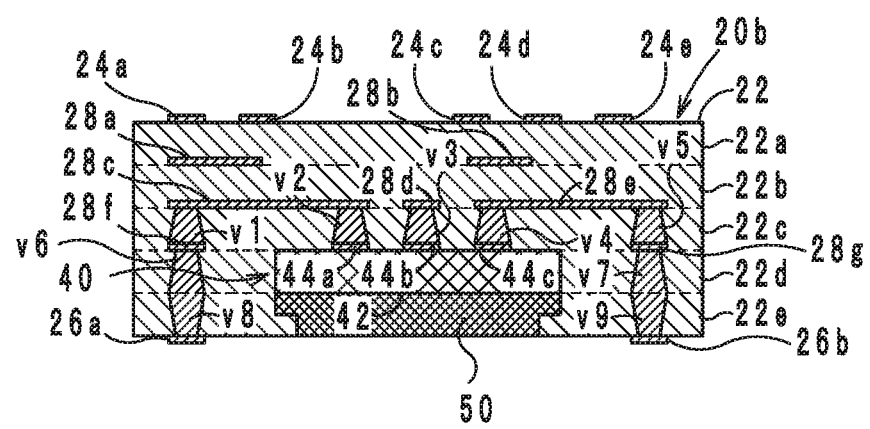
FIG. 7A is a sectional view of a multilayer board 20b according to a second modification of a preferred embodiment of the present invention.
Figure 7A:
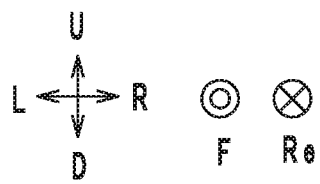

A multilayer board 20b according to a second modification of a preferred embodiment of the present invention will be described below in reference to the drawings. FIG. 7A is a sectional view of the multilayer board 20b according to the second modification.

The multilayer board 20b differs from the multilayer board 20 in the shape of the heat dissipator 50. The following description of the multilayer board 20b is focused on the difference.

In the multilayer board 20b, the side surfaces of the heat dissipator 50 each preferably include a step. More specifically, when the heat dissipator 50 is viewed from above, the upper half of the heat dissipator 50 is larger than the lower half of the heat dissipator 50, and the upper half of the heat dissipator 50 extends farther outward than the lower half in the front-rear and the right-left directions.

The multilayer board 20b with this structure has the same or substantially the same advantages and effects as the multilayer board 20.

The side surfaces of the heat dissipator 50 each preferably include a step. Therefore, it is easy to form the heat dissipator 50 from a metal plate or a metal block.

Figure 7B:
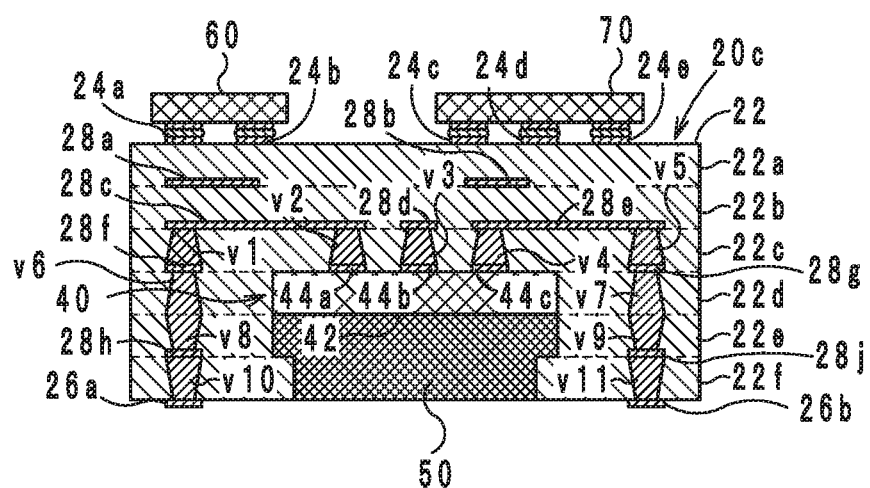
FIG. 7B is a sectional view of a multilayer board 20c according to a third modification of a preferred embodiment of the present invention.
Figure 7B:
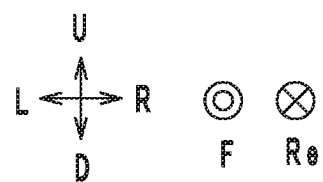

A multilayer board 20c according to a third modification of a preferred embodiment of the present invention will be described below in reference to the drawings. FIG. 7B is a sectional view of the multilayer board 20c according to the third modification.

In the multilayer board 20c, the heat dissipator 50 is disposed across the insulating sheets 22e and 22f. More specifically, as in the multilayer board 20b, the side surfaces of the heat dissipator 50 in the multilayer board 20c each preferably include a step. In the multilayer board 20c, however, the upper half of the heat dissipator 50 is fitted in the hole in the insulating sheet 22e, and the lower half of the heat dissipator 50 is fitted in the hole in the insulating sheet 22f.

The multilayer board 20c with this structure has the same or substantially the same advantages and effects as the multilayer board 20. In the multilayer board 20c, it is not necessary to provide a step in the inner surface of the hole of the insulating sheet 22e, which is necessary in the multilayer board 20b. Therefore, it is easier to fabricate the multilayer board 20c than to fabricate the multilayer board 20b.

Figure 8:
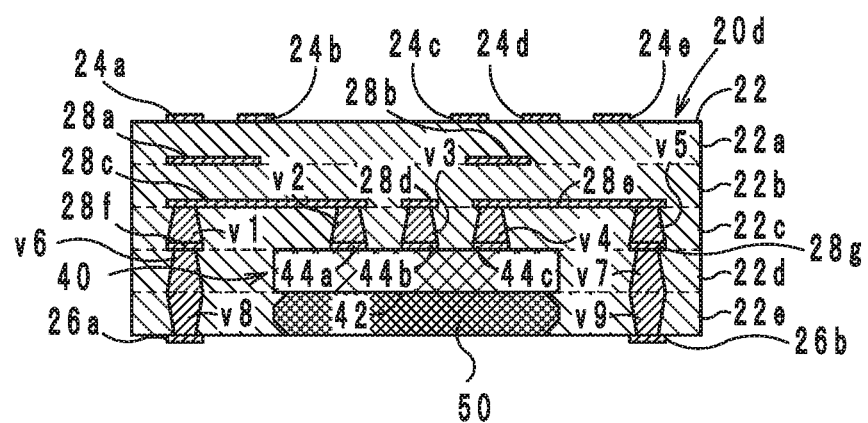
FIG. 8 is a sectional view of a multilayer board 20d according to a fourth modification of a preferred embodiment of the present invention.
Figure 8:
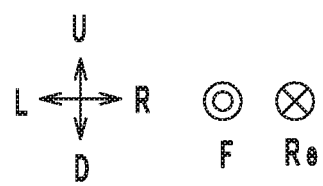

A multilayer board 20d according to a fourth modification of a preferred embodiment of the present invention will be described below in reference to the drawings. FIG. 8 is a sectional view of the multilayer board 20d according to the fourth modification.

The multilayer board 20d differs from the multilayer board 20 in the shape of the heat dissipator 50. The following description of the multilayer board 20d is focused on the difference.

In the multilayer board 20d, among sections of the heat dissipator 50 perpendicular or substantially perpendicular to the up-down direction, the section located at the vertical center or approximate center of the heat dissipator 50 has a larger size. With decreasing distance from either the front surface or the back surface of the heat dissipator 50, the section of the heat dissipator 50 perpendicular or substantially perpendicular to the up-down direction becomes smaller. In the heat dissipator 50 with such a shape, there is a combination of a section S1 and a section S2 in which the section S2 extends farther outward than the section S1 when viewed above. Therefore, the multilayer board 20d has the same or substantially the same effects as the multilayer board 20.

Figure 9:
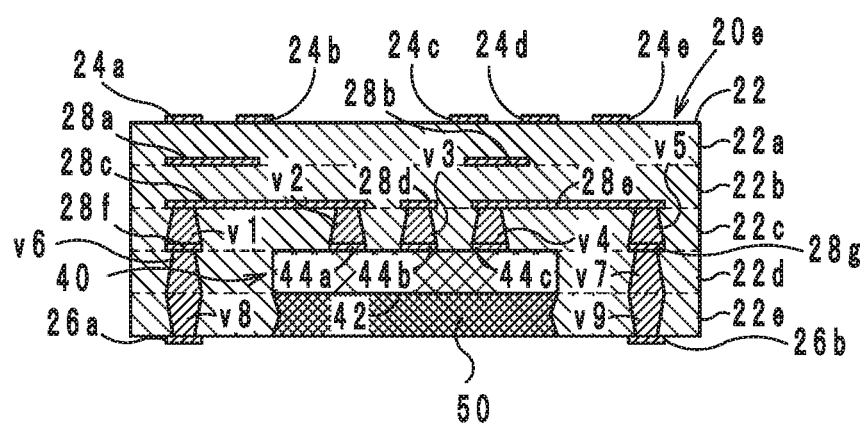
FIG. 9 is a sectional view of a multilayer board 20e according to a fifth modification of a preferred embodiment of the present invention.
Figure 9:
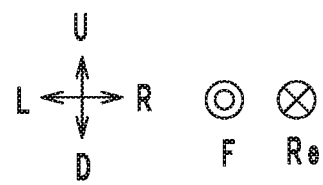

A multilayer board 20e according to a fifth modification of a preferred embodiment of the present invention will be described below in reference to the drawings. FIG. 9 is a sectional view of the multilayer board 20e according to the fifth modification.

The multilayer board 20e differs from the multilayer board 20 in the shape of the heat dissipator 50. The following description of the multilayer board 20e is focused on the difference.

In the multilayer board 20e, among sections of the heat dissipator 50 perpendicular or substantially perpendicular to the up-down direction, the section at the vertical center or approximate center of the heat dissipator 50 has the smallest size. With decreasing distance from either the front surface or the back surface of the heat dissipator 50, the section of the heat dissipator 50 perpendicular or substantially perpendicular to the up-down direction becomes larger. In the heat dissipator 50 with such a shape, there is a combination of a section S1 and a section S2 in which the section S2 extends farther outward than the section S1 when viewed from above. Therefore, the multilayer board 20e has the same or substantially the same effects as the multilayer board 20.

Figure 10A:
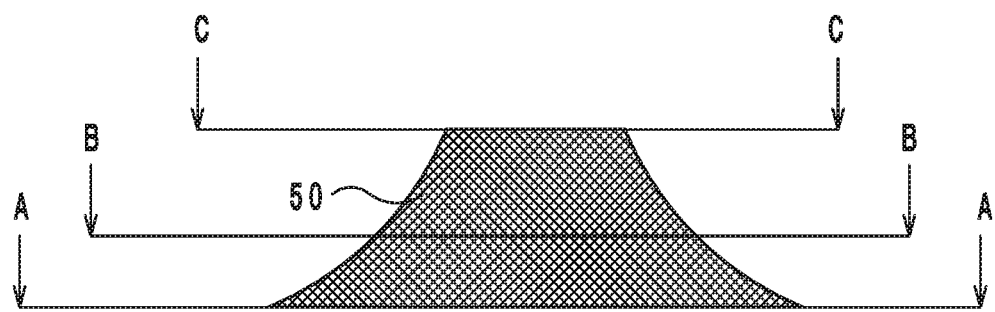
FIG. 10A is a sectional view of a heat dissipator 50 of a multilayer board 20f along a line perpendicular to a front-rear direction.
Figure 10A:
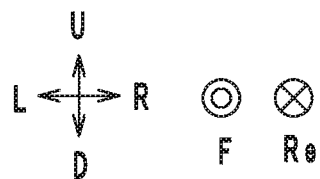
Figure 10B:
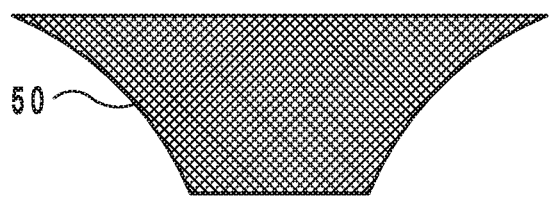
FIG. 10B is a sectional view of the heat dissipator 50 of the multilayer board 20f along a line perpendicular to a right-left direction.
Figure 10B:
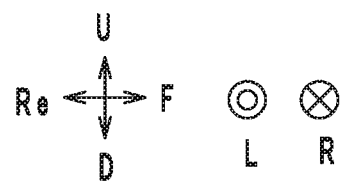
Figure 11A:
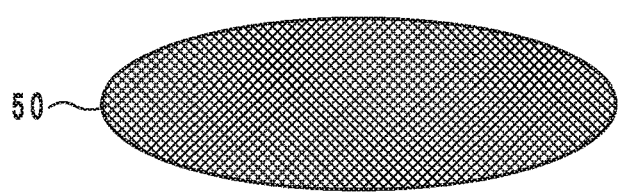
FIG. 11A is a sectional view of the multilayer board 20f along the line A-A.
Figure 11A:
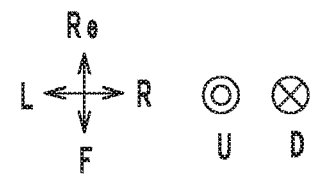
Figure 11B:
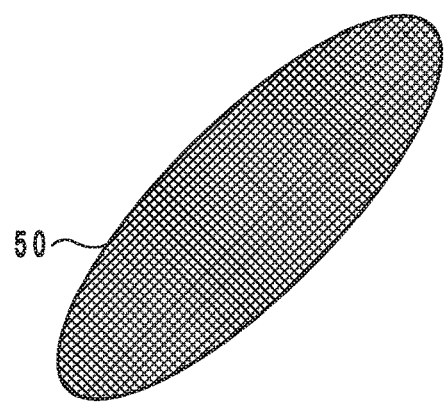
FIG. 11B is a sectional view of the multilayer board 20f along the line B-B.
Figure 11B:
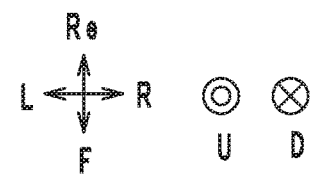
Figure 11C:
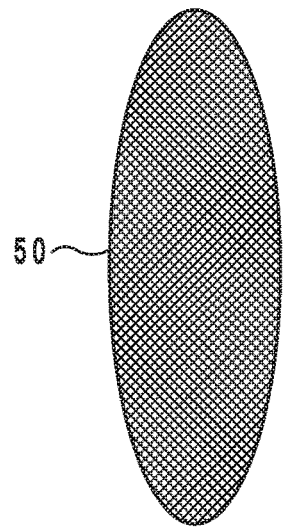
FIG. 11C is a sectional view of the multilayer board 20f along the line C-C.
Figure 11C:
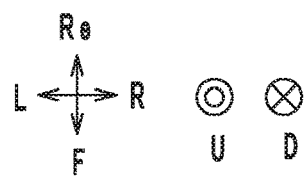
Figure 12:
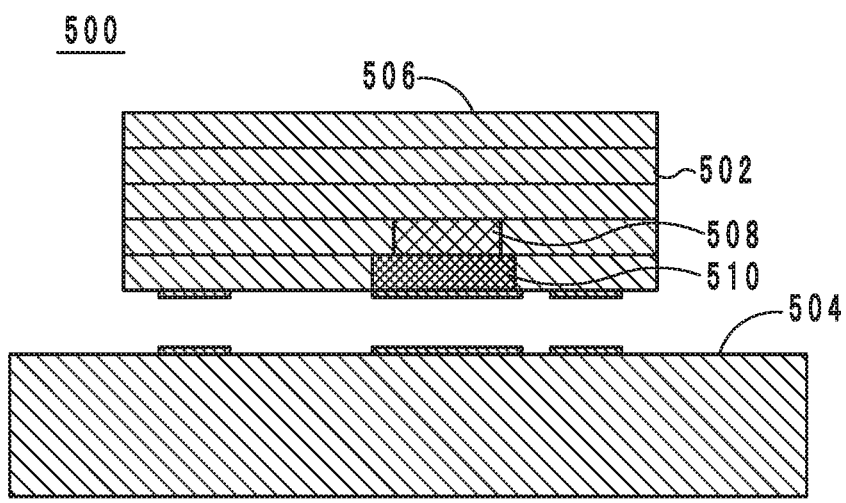
FIG. 12 is a sectional view of the wireless communication module 500 disclosed in Japanese Patent Application Publication No. 2003-60523.
Figure 12:
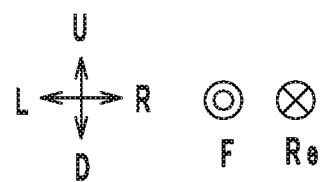

A multilayer board 20f according to a sixth modification of a preferred embodiment of the present invention will be described below in reference to the drawings. FIG. 10A is a sectional view of the heat dissipator 50 of the multilayer board 20f along a line perpendicular or substantially perpendicular to the front-rear direction. FIG. 10B is a sectional view of the heat dissipator 50 of the multilayer board 20f along a line perpendicular or substantially perpendicular to the right-left direction. FIG. 11A is a sectional view of the multilayer board 20f along the line A-A. FIG. 11B is a sectional view of the multilayer board 20f along the line B-B. FIG. 11C is a sectional view of the multilayer board 20f along the line C-C.

In the multilayer board 20f, sections of the heat dissipator 50 perpendicular or substantially perpendicular to the up-down direction (which will hereinafter be referred to simply as sections) are the same or substantially the same in size and shape regardless of at what position in the up-down direction the sections are located. More specifically, the sections of the heat dissipator 50 are preferably elliptical as shown in FIGS. 11A to 11C. The back surface of the heat dissipator 50 is in the shape of an ellipse of which long axis is parallel or substantially parallel to the right-left direction. The section of the heat dissipator 50 at an upper level has an elliptical shape obtained by counterclockwise turning the section thereof at a lower level. Then, the upper surface of the heat dissipator 50 is in the shape of an ellipse of which long axis is parallel or substantially parallel to the front-rear direction. Accordingly, for any combination of a section S1 and a section S2 of the heat dissipator 50, it is true that the section S2 extends farther outward than the section S1 when viewed from above. Therefore, the multilayer board 20f has the same or substantially the same effects as the multilayer board 20.

As long as there is a combination of a section S1 and a section S2 in which the section S2 extends farther outward than the section S1, the sections S1 and S2 in any combination may be the same or substantially the same as each other as shown in FIGS. 11A to 11C, or the section S2 may be larger than the section S1 in any combination although this case is not shown in the drawings.

Multilayer boards and electronic devices according to preferred embodiments of the present invention are not limited to the multilayer boards 20, 20a to 20f and the electronic devices 10 and 10a, and it is possible to make various changes and modifications to these multilayer boards and electronic devices without departing from the gist and scope of the present invention.

The multilayer boards 20, 20a to 20f and the electronic devices 10 and 10a may be arbitrarily combined.

The back surfaces of the heat dissipators 50, 50a and 50b may be plated. External electrodes may be disposed on the back surface of the base 22 so as to cover the back surface of the heat dissipator 50 or the back surfaces of the heat dissipators 50a and 50b. When the back surface of the heat dissipator 50 or the back surfaces of the heat dissipators 50a or 50b are covered with external electrodes, the heat dissipator 50 or the heat dissipators 50a and 50b are more effectively prevented from detaching from the base 22. The plating film and the external electrodes define and function as a joining member to connect between the heat dissipator 50 or the heat dissipators 50a and 50b and the external electrode 104b.

Preferred embodiments of the present invention are effectively applicable to multilayer boards and electronic devices, and in particular, preferred embodiments of the present invention are useful to reduce the risk of detachment of a heat dissipator from a base.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer board comprising:
   a base including insulating layers stacked on one another along a layer stacking direction, and a mounting surface located at an end of the base in a first direction along the layer stacking direction;
   an electronic component disposed inside the base; and
   a first heat dissipator extending through one or more of the insulating layers from a surface of the electronic component located at an end of the electronic component in the first direction along the layer stacking direction to the mounting surface and not connected to any external electrodes of the electronic component, the first heat dissipator being made of a material having a second coefficient of thermal conductivity higher than a first coefficient of thermal conductivity of a material of the insulating layers; wherein
   a section of the first heat dissipator which is perpendicular or substantially perpendicular to the layer stacking direction is a first section, a section of the first heat dissipator which is perpendicular or substantially perpendicular to the layer stacking direction and located farther in a second direction along the layer stacking direction than the first section is a second section, and in a combination of the first section and the second section, the second section extends farther outward than the first section when viewed from the layer stacking direction.

2. The multilayer board according to claim 1, wherein no external electrodes are disposed on the surface of the electronic component located at the end of the electronic component in the first direction along the layer stacking direction.

3. The multilayer board according to claim 1, wherein a first external electrode is disposed on a surface of the electronic component located at an end of the electronic component in the second direction along the layer stacking direction.

4. The multilayer board according to claim 3, further comprising:
   a second external electrode disposed on the mounting surface; and
   a connector connecting the first external electrode to the second external electrode and including an interlayer connection conductor and a wiring conductive layer.

5. The multilayer board according to claim 4, wherein the connector extends from the first external electrode in the second direction along the layer stacking direction, extends in a direction perpendicular or substantially perpendicular to the layer stacking direction, and further extends in the first direction along the layer stacking direction to the second external electrode.

6. The multilayer board according to claim 1, wherein in any combination of the first section and the second section, the second section extends farther outward than the first section when viewed from the layer stacking direction.

7. The multilayer board according to claim 1, wherein in any combination of the first section and the second section, the second section is larger than the first section.

8. The multilayer board according to claim 1, wherein the electronic component is located nearer to the mounting surface than to a surface of the base at an end of the base in the second direction along the layer stacking direction.

9. The multilayer board according to claim 1, wherein the first heat dissipator is a metal plate or a metal block.

10. The multilayer board according to claim 1, further comprising:

a second heat dissipator extending through one or more of the insulating layers from the surface of the electronic component located at the end of the electronic component in the first direction along the layer stacking direction to the mounting surface and not connected to any external electrodes of the electronic component, the second heat dissipator being made of a material having a coefficient of thermal conductivity higher than the first coefficient of thermal conductivity of the material of the insulating layers; wherein the first heat dissipator and the second heat dissipator are arranged in a direction perpendicular or substantially perpendicular to the layer stacking direction with a space therebetween.

11. The multilayer board according to claim 10, further comprising a wiring conductive layer disposed between the first heat dissipator and the second heat dissipator.

12. The multilayer board according to claim 1, wherein the first heat dissipator is connected to the electronic component via a first joining member made of a material having a third coefficient of thermal conductivity higher than the first coefficient of thermal conductivity.

13. The multilayer board according to claim 1, wherein the material of the insulating layers includes a thermoplastic resin.

14. An electronic device comprising:
a mother board; and
a multilayer board mounted on the mother board; wherein the multilayer board includes:
  a base including insulating layers stacked on one another along a layer stacking direction, and a mounting surface located at an end of the base in a first direction along the layer stacking direction where the insulating layers are stacked;
  an electronic component disposed inside the base; and
  a first heat dissipator extending through one or more of the insulating layers from a surface of the electronic component located at an end of the electronic component in the first direction along the layer stacking direction to the mounting surface and not connected to any external electrodes of the electronic component, the first heat dissipator being made of a material having a second coefficient of thermal conductivity higher than a first coefficient of thermal conductivity of a material of the insulating layers;
  the first heat dissipator is in direct contact with the mother board or is connected to the mother board via a second joining member made of a material having a fourth coefficient of thermal conductivity higher than the first coefficient of thermal conductivity; and
  a section of the first heat dissipator which is perpendicular or substantially perpendicular to the layer stacking direction is a first section, a section of the first heat dissipator which is perpendicular or substantially perpendicular to the layer stacking direction and located farther in a second direction along the layer stacking direction than the first section is a second section, and in a combination of the first section and the second section, the second section extends farther outward than the first section when viewed from the layer stacking direction.

15. The electronic device according to claim 14, wherein the mother board includes a third external electrode; and
the first heat dissipator is in direct contact with the third external electrode or is connected to the third external electrode via the second joining member.

16. The electronic device according to claim 14, wherein the material of the insulating layers includes a thermoplastic resin.

17. The electronic device according to claim 14, wherein no external electrodes are disposed on the surface of the electronic component located at the end of the electronic component in the first direction along the layer stacking direction.

18. The electronic device according to claim 14, wherein a first external electrode is disposed on a surface of the electronic component located at an end of the electronic component in the second direction along the layer stacking direction.

19. The electronic device according to claim 14, wherein in any combination of the first section and the second section, the second section extends farther outward than the first section when viewed from the layer stacking direction.

20. The electronic device according to claim 14, wherein in any combination of the first section and the second section, the second section is larger than the first section.

* * * * *